United States Patent
Lin (10) Patent No.: US 8,109,772 B2
(45) Date of Patent: Feb. 7, 2012

(54) USB BASED EXPRESSCARD DEVICE

(75) Inventor: Hun-Yi Lin, Taipei Hsien (TW)

(73) Assignee: D&C Technology Co., Ltd., Hsin Tien, Taipei Hsien (TW)

( * ) Notice: Subject to any disclaimer, the term of this patent is extended or adjusted under 35 U.S.C. 154(b) by 0 days.

(21) Appl. No.: 12/840,698

(22) Filed: Jul. 21, 2010

(65) Prior Publication Data

US 2011/0058329 A1    Mar. 10, 2011

(30) Foreign Application Priority Data

Sep. 10, 2009    (TW) .............................. 98216746 U (51) Int. Cl.
*H01R 12/00*    (2006.01)
(52) U.S. Cl. ... 439/76.1; 439/630; 439/946; 439/607.31
(58) Field of Classification Search ................ 439/76.1, 439/630, 660, 946, 607.31
See application file for complete search history.

(56) References Cited

U.S. PATENT DOCUMENTS

| | | | | |
|---|---|---|---|---|
| 7,184,274 | B2 * | 2/2007 | Wu et al. | 361/752 |
| 7,382,625 | B2 * | 6/2008 | Thornton et al. | 361/737 |
| 7,489,515 | B2 * | 2/2009 | Huang | 361/737 |
| 7,614,912 | B2 * | 11/2009 | Cheng | 439/607.31 |
| 7,859,850 | B2 * | 12/2010 | Chan et al. | 361/737 |

* cited by examiner

*Primary Examiner* — Hien Vu
(74) *Attorney, Agent, or Firm* — Muncy, Geissler, Olds & Lowe, PLLC (57) ABSTRACT

A USB based ExpressCard device having a dimension equal to a standard ExpressCard is disclosed to include an ExpressCard having a circuit board accommodated in an electrically insulative bracket and surrounded by a top cover shell and a bottom cover shell, and a USB3.0 connector mounted in an opening in a front locating shell of the electrically insulative bracket of the ExpressCard and having the rear bonding portions of first and second conducting terminals thereof respectively bonded to respective contacts at the circuit board by SMT (surface mounting technology).

10 Claims, 8 Drawing Sheets

USB BASED EXPRESSCARD DEVICE

This application claims the priority benefit of Taiwan patent application number 098216746 filed on Sep. 10, 2009.

BACKGROUND OF THE INVENTION

1. Field of the Invention

The present invention relates to ExpressCard technology and more particularly, to a USB based ExpressCard device, which incorporates a USB3.0 connector and an ExpressCard together, and employs SMT (surface mounting technology) to bond the rear bonding portions of the first and second conducting terminals of the USB3.0 connector to the circuit board of the ExpressCard, avoiding increasing the size.

2. Description of the Related Art

Figure 8:
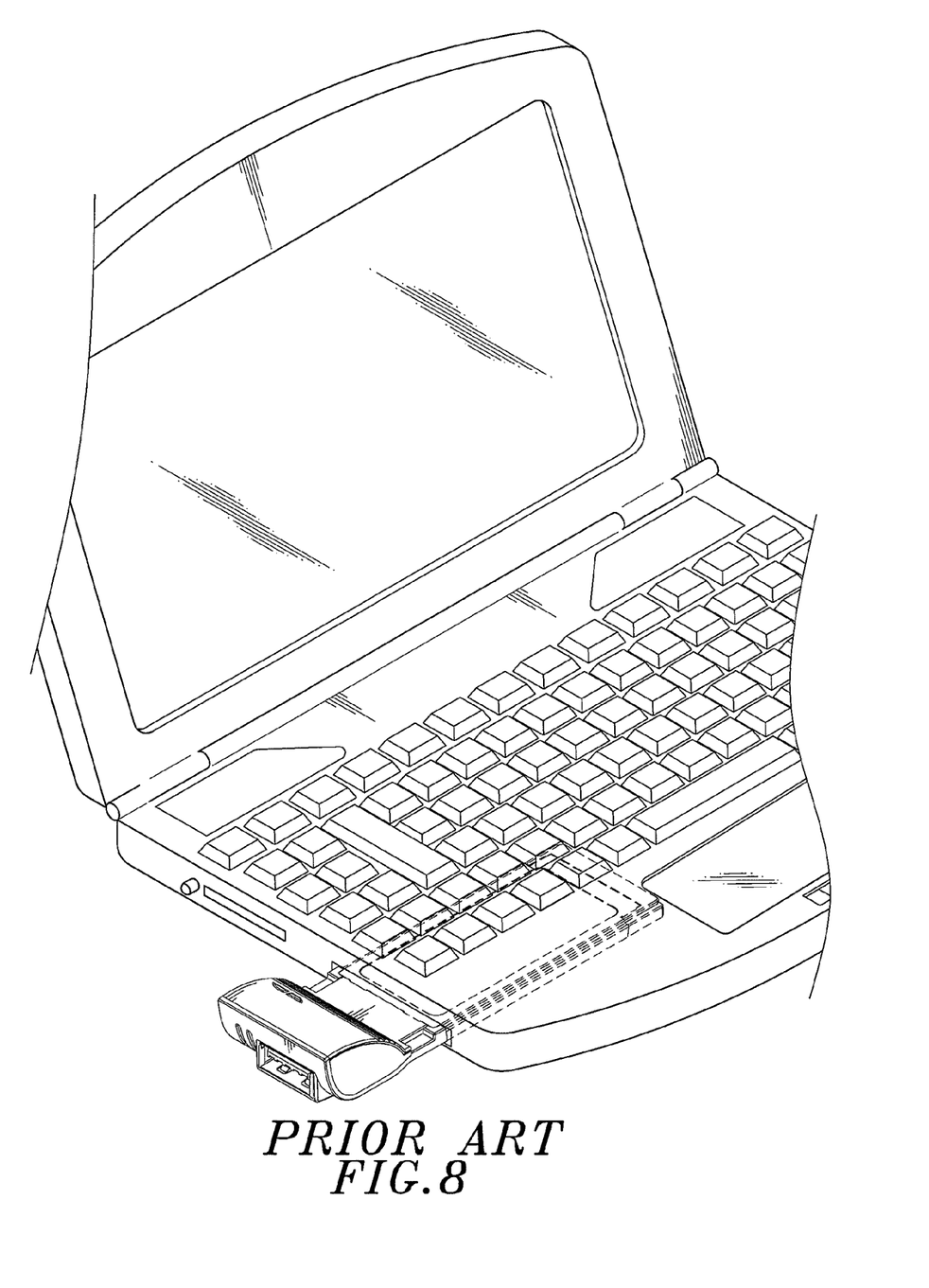
FIG. 8 is a schematic drawing showing an application status of a USB based ExpressCard device according to the prior art.

The ExpressCard standard specifies two factors, ExpressCard/34 (34 mm wide) and ExpressCard/54 (54 mm wide, in an L-shape). Using an ExpressCard in a notebook computer can expand the functions. Further, a USB based ExpressCard device is known, comprising a shell, a circuit board mounted in the shell, a terminal holder block located on the rear side of the circuit board for the connection of a matching connector upon insertion of the USB based ExpressCard into an ExpressCard slot of a first electronic apparatus, for example, notebook computer, and a USB (USB2.0) connector located on the front side of the circuit board for the connection of a second electronic apparatus. Subject to the limitations of data transmission speed and power supply stability, this design of USB based ExpressCard device is simply suitable for use in a low transmission speed peripheral apparatus (such as card reader, printer, mobile disk drive, internet telephone or webcam), not practical for use in a high capacity hard disk drive, DVD copier, DVD player, blue light DVD copier or blue light DVD player. For high transmission speed and high power application, USB3.0 based ExpressCard devices are developed. However, an ExpressCard has a specific size. The thickness of a standard ExpressCard is 5 mm. For the mounting of a USB3.0 connector in a standard ExpressCard to make a USB3.0 based ExpressCard device, the length of the circuit board of the ExpressCard must be extended, or an extra circuit board must be added to the front side of the original circuit board of the ExpressCard. Either of the two methods complicates the circuit layout and increases the device height. As shown in FIG. 8, when a USB3.0 based ExpressCard device is inserted into an ExpressCard slot of a notebook computer, the USB3.0 based ExpressCard device cannot be completely received inside the notebook computer. The part of the USB3.0 based ExpressCard device that protrudes out of the peripheral wall of the notebook computer may be impacted by an external object accidentally, causing damage.

Therefore, it is desirable to provide a USB3.0 based ExpressCard device that eliminates the aforesaid problems.

SUMMARY OF THE INVENTION

The present invention has been accomplished under the circumstances in view. It is one object of the present invention to provide a USB3.0 based ExpressCard device, which has a USB3.0 connector be incorporated into an ExpressCard together without increasing the dimension of the ExpressCard, avoiding accidental impact damage.

To achieve this and other objects of the present invention, a USB3.0 based ExpressCard device comprises an ExpressCard, and a USB3.0 connector mounted in the front side of the ExpressCard. The ExpressCard comprises an electrically insulative bracket, a circuit board accommodated in the electrically insulative bracket, and top and cover shells covering the electrically insulative bracket at top and bottom sides. The USB3.0 connector is mounted in an opening in a front locating shell of the electrically insulative bracket of the ExpressCard, having first conducting terminals and second conducting terminals. The first and second conducting terminals have the respective rear bonding portions kept on one same horizontal plane and respectively bonded to respective contacts at the circuit board by SMT (surface mounting technology). Thus, adding the USB3.0 connector to the ExpressCard does not increase the size of the ExpressCard.

Further, the metal shield of the USB3.0 connector can be formed of two symmetrical halves that are respectively formed integral with the top and bottom cover shells of the ExpressCard, facilitating installation.

Further, after installation of the USB3.0 connector in the opening in the front locating shell of the electrically insulative bracket of the ExpressCard, the USB3.0 does not protrude over the front side of the ExpressCard, thus the length and width of the USB based ExpressCard device are maintained equal to the length and width of the ExpressCard. Therefore, the USB based ExpressCard device can be completely inserted into the ExpressCard slot of an electronic apparatus, avoiding accidental impact damage.

DETAILED DESCRIPTION OF THE PREFERRED EMBODIMENT

Referring to FIGS. 1~4, an USB based ExpressCard device in accordance with a first embodiment of the present invention is shown comprising an ExpressCard 1 and a USB connector 2 installed in one side of the ExpressCard 1. The USB connector 2 according to this embodiment is a female type USB3.0 connector.

The ExpressCard 1 comprises an electrically insulative bracket 11, a circuit board 12, a terminal holder block 13, a bottom cover shell 14 and a top cover shell 15.

Figure 1:
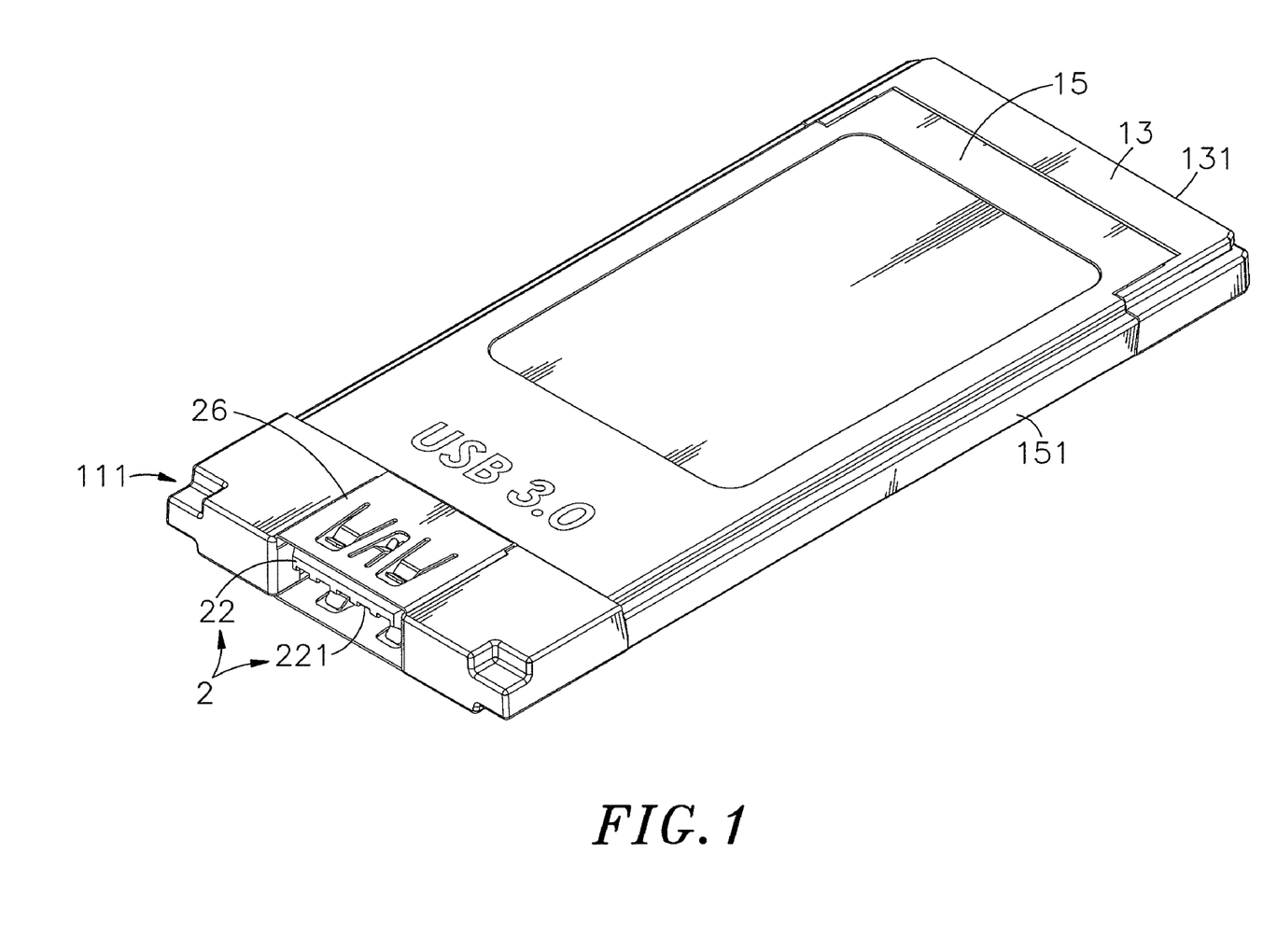
FIG. 1 is an oblique elevational view of a USB based ExpressCard device in accordance with a first embodiment of the present invention.
Figure 2:
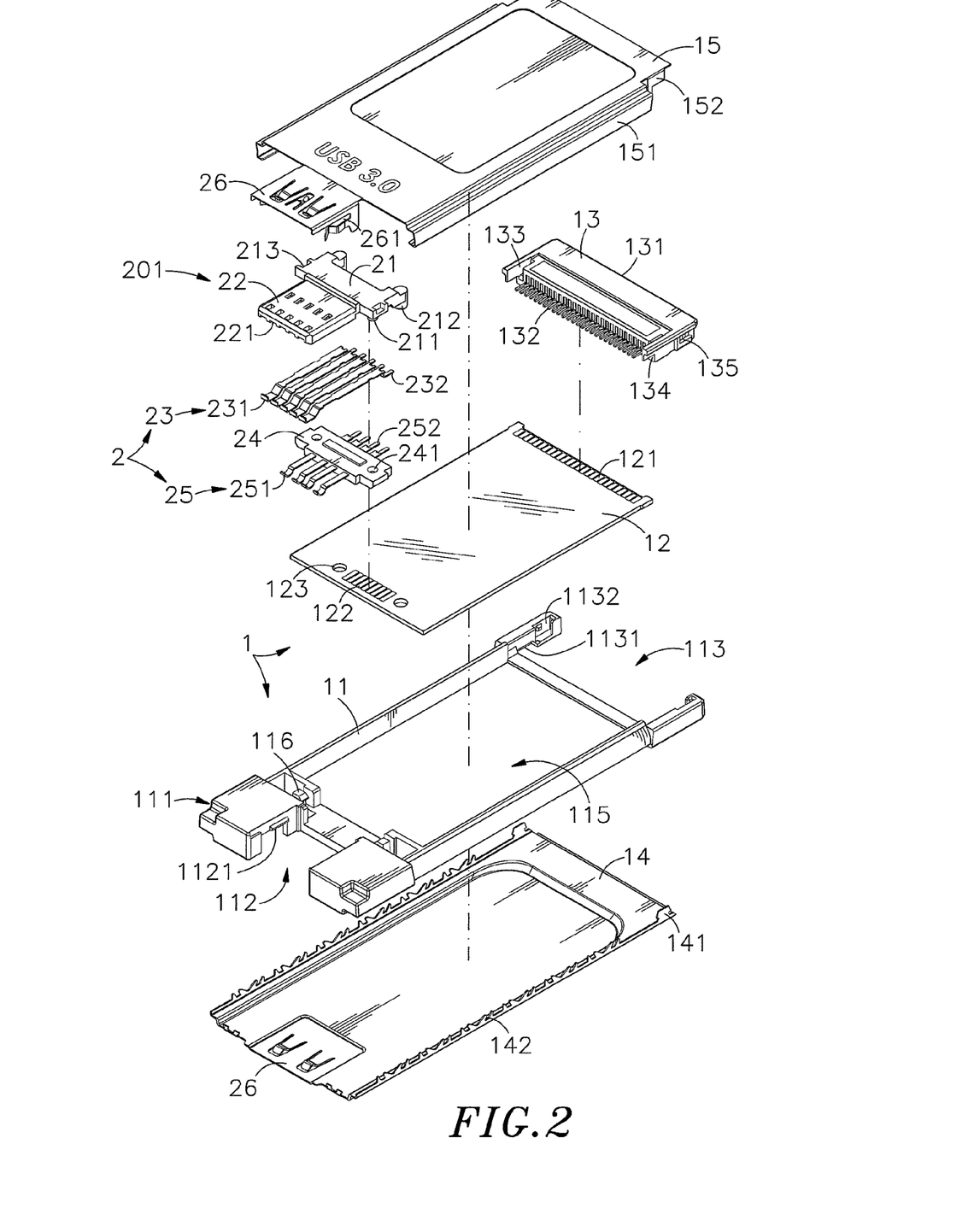
FIG. 2 is an exploded view of the USB based ExpressCard device in accordance with the first embodiment of the present invention.
Figure 3:
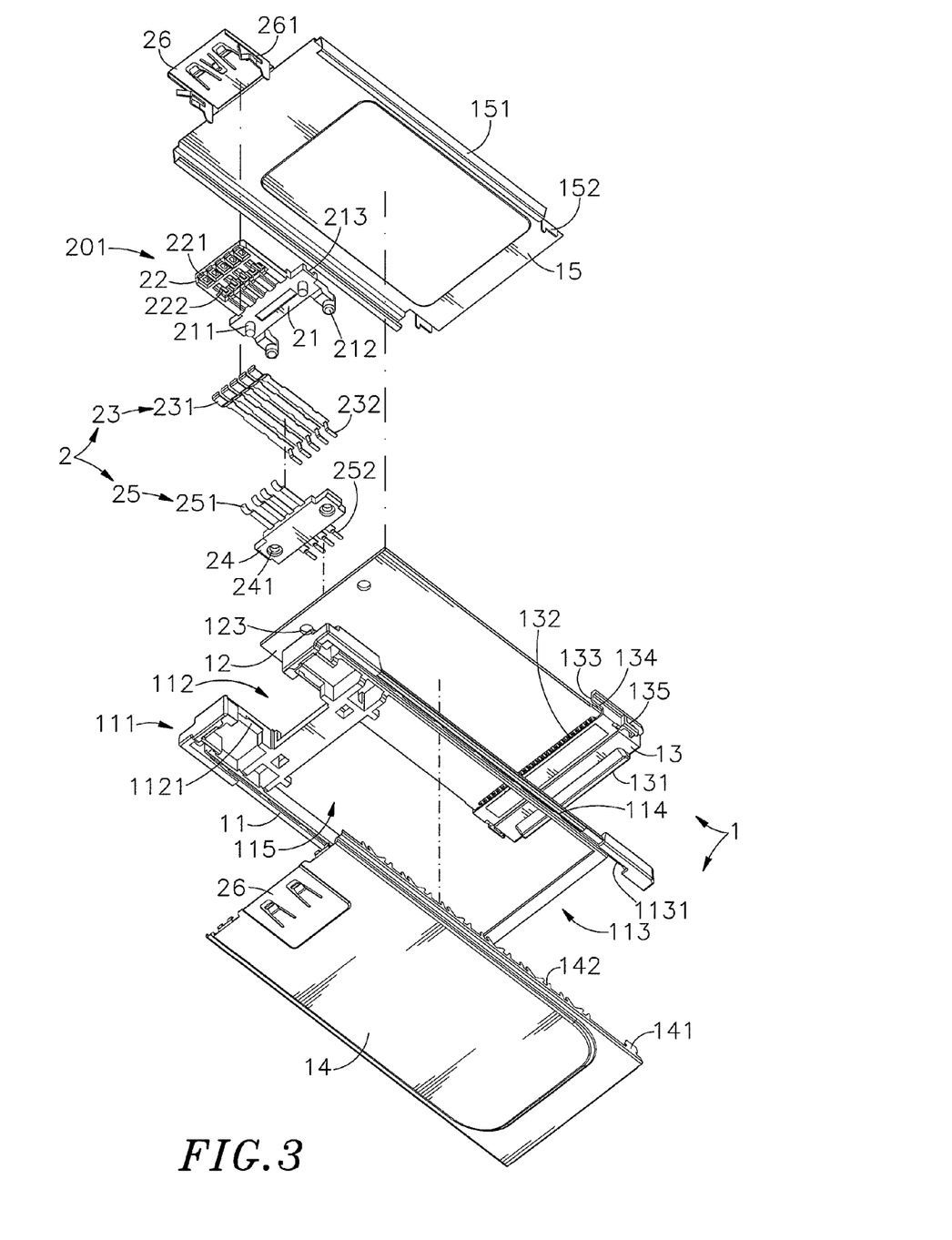
FIG. 3 corresponds to FIG. 2 when viewed from another direction.

The electrically insulative bracket 11 comprises a front locating shell 111 located on one side, namely, the front side, an opening 112 vertically cut through the front locating shell 111, a retaining rib 1121 protruded from the front locating shell 111 at each of two opposite sides relative to the opening 112, a rear terminal holder block mounting structure 113 located on the other side, namely, the rear side and having retaining notch 1131 and a retaining groove 1132 disposed at each of two opposite lateral sides thereof, a center open space 115 defined between the front locating shell 111 and the rear terminal holder block mounting structure 113, a longitudinal bottom mounting groove 114 longitudinally located on the bottom side between the front locating shell 111 and the rear terminal holder block mounting structure 113 at each of two opposite lateral sides relative to the center open space 115 and a retaining rod 116 disposed between the front locating shell 111 and the center open space 115 at each of two opposite lateral sides relative to the opening 112.

The circuit board 12 is accommodated in the center open space 115 of the electrically insulative bracket 11, comprising a set of first contacts 121 disposed at one side (the rear side) corresponding to the rear terminal holder block mounting structure 113 of the electrically insulative bracket 11, a set of second contacts 122 disposed at an opposite side (the front side) corresponding to the front locating shell 111 of the electrically insulative bracket 11 and two mounting through holes 123 cut through the top and bottom walls thereof and respectively disposed at two opposite lateral sides relative to the set of second contacts 122.

The terminal holder block 13 is mounted in the rear terminal holder block mounting structure 113 of the electrically insulative bracket 11, comprising a set of insertion slots 131 arranged in parallel and extending through the rear side thereof for the insertion of an external electrical connector, a set of metal terminals 132 respectively mounted in the insertion slots 131 and respectively electrically connected to the first contacts 121 of the circuit board 12, two mounting grooves 133 respectively disposed at two opposite lateral sides thereof, two press portions 134 respectively disposed at an outer side relative to the mounting grooves 133 for pressing on the top wall of the circuit board 12 and two retaining ribs 135 for engaging into the retaining grooves 1132 of the rear terminal holder block mounting structure 113 of the electrically insulative bracket 11.

The bottom cover shell 14 is covered on the bottom side of the electrically insulative bracket 11, comprising two rear retaining rods 141 bilaterally disposed at one side, namely, the rear side thereof for engaging into the retaining notches 1131 of the rear terminal holder block mounting structure 113 of the electrically insulative bracket 11 and two toothed longitudinal mounting flanges 142 respectively longitudinally extending along two opposite lateral sides thereof for engaging into the longitudinal bottom mounting grooves 114 of the electrically insulative bracket 11 respectively.

The top cover shell 15 is covered on the top side of the electrically insulative bracket 11, comprising two longitudinal coupling flanges 151 respectively extended from two opposite lateral sides thereof for hooking on the two opposite lateral sides of the electrically insulative bracket 11 and two rear positioning flanges 152 bilaterally disposed at the rear side for engaging into the mounting grooves 133 of the terminal holder block 13 respectively.

Figure 4:
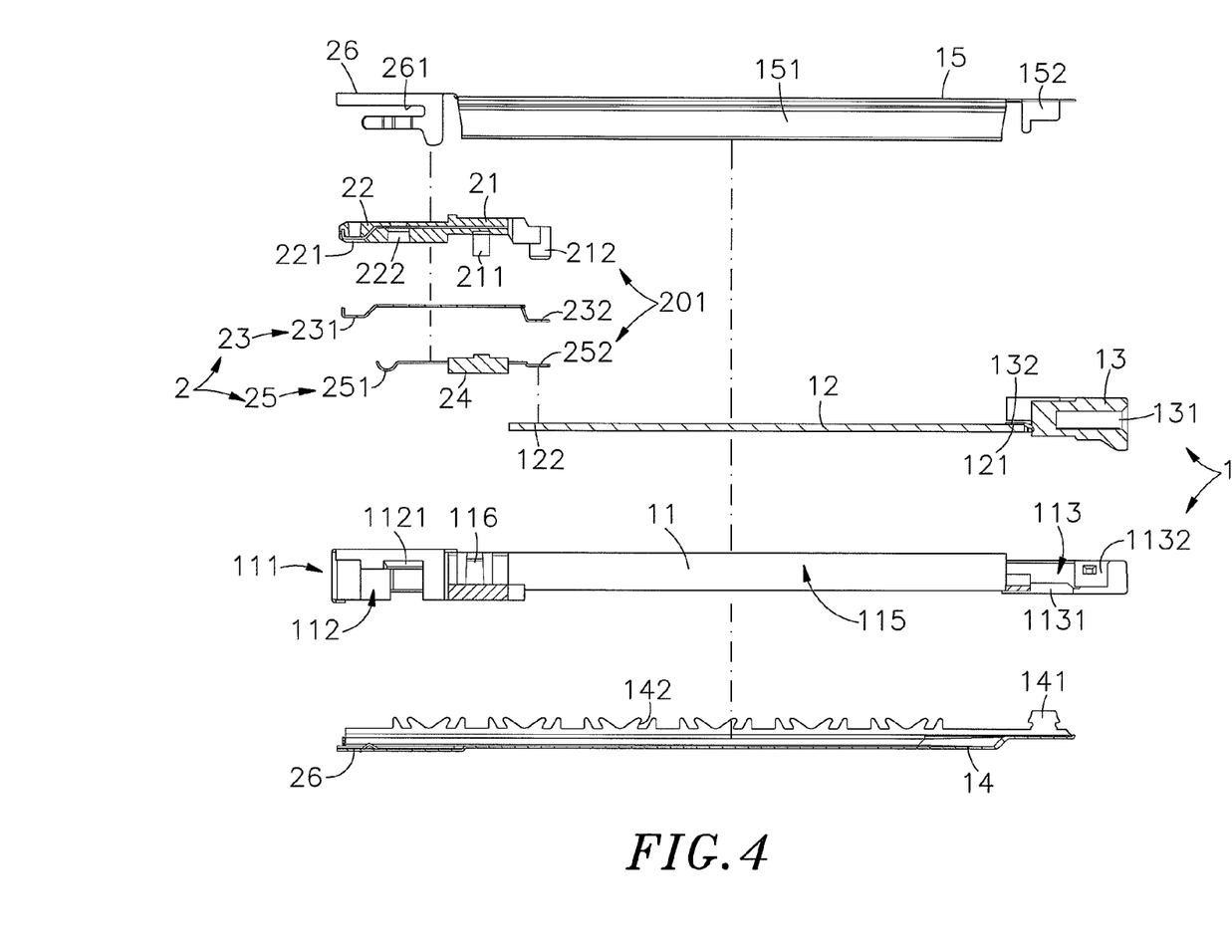
FIG. 4 is an exploded sectional side view of the USB based ExpressCard device in accordance with the first embodiment of the present invention.

The USB3.0 connector 2 comprises an electrically insulative body 201 formed of a base member 21, a tongue plate 22 and a locating block 24, a set of first conducting terminals 23, a set of second conducting terminals 25 and a metal shield 26. The base member 21 has a plurality of bottom mounting rods 211, two bottom locating rods 212 for engaging into the mounting through holes 123 of the circuit board 12, and two locating grooves 213 bilaterally disposed at the top side. The tongue plate 22 extends forwardly from the front side of the base member 21, defining a plurality of first terminal grooves 221 and second terminal grooves 222. Further, the first terminal grooves 221 extend through the bottom wall of the base member 21. The first conducting terminals 23 are respectively mounted in the first terminal grooves 221 inside the tongue plate 22, each having a front contact portion 231 suspending below the bottom wall of the tongue plate 22 and a rear bonding portion 232. The locating block 24 is mounted on the bottom side of the base member 21, having a plurality of mounting holes 241 for receiving the bottom mounting rods 211 of the base member 21. The second conducting terminals 25 are mounted in the locating block 24 and extending through the front and rear sides of the locating block 24, each having a front contact portion 251 and a rear bonding portion 252. The metal shield 26 surrounds the tongue plate 26, having two retaining holes 261 respectively disposed at two opposite lateral sides thereof for receiving the retaining ribs 1121 of the electrically insulative bracket 11.

During the assembly process of the USB based Express-Card device, engage the toothed longitudinal mounting flanges 142 and rear retaining rods 141 of the bottom cover shell 14 into the longitudinal bottom mounting grooves 114 and retaining notches 1131 of the electrically insulative bracket 11 respectively, and then force the retaining ribs 135 of the terminal holder block 13 into the retaining grooves 1132 of the rear terminal holder block mounting structure 113 of the electrically insulative bracket 11 respectively. After installation of the first conducting terminals 23 in the first terminal grooves 221 inside the tongue plate 22 and installation of the second conducting terminals 25 in the locating block 24, the locating block 24 is attached to the bottom side of the tongue plate 22 to force the mounting holes 241 into engagement with the bottom mounting rods 211 of the base member 21 and to have the front contact portions 251 of the second conducting terminals 25 be positioned in the second terminal grooves 222 of the tongue plate 22. At this time, the first conducting terminals 23 and the second conducting terminals 25 are respectively positioned in the inside of the base member 21 and the bottom side of the tongue plate 22 at different elevations, the front contact portions 231 of the first conducting terminals 23 and the front contact portions 251 of the second conducting terminals 25 are arranged in two longitudinally spaced rows, avoiding accidental contact between the first conducting terminals 23 and the front contact portions 251. Thereafter, the rear bonding portions 232;253 of the first and second conducting terminals 23;25 are kept in horizontal and respectively electrically bonded to the second contacts 122 of the circuit board 12 by SMT (surface mounting technology). Thereafter, insert the bottom locating rods 212 of the base member 21 into the mounting through holes 123 of the circuit board 12, and then force the locating grooves 213 of the base member 21 into engagement with the retaining rods 116 of the electrically insulative bracket 11 respectively, and then bond the metal terminals 132 to the first contacts 121 of the circuit board 12 respectively by means of SMT (surface mounting technology). When compared to the conventional technique of inserting the metal terminals through the top and bottom walls of the circuit board and then bonding the metal terminals to the bottom wall of the circuit board with a solder, the installation of the metal terminals 132 and the first and second conducting terminals 23;25 in the circuit board 12 does not increase much the height. Thereafter, the top cover shell 15 is covered on the top side of the electrically insulative bracket 11 over the circuit board 12 to hook the longitudinal coupling flanges 151 on the two opposite lateral sides of the electrically insulative bracket 11 and engage the rear positioning flanges 152 into the mounting grooves 133 of the terminal holder block 13, finishing the assembly process of the USB based ExpressCard device. Further, the metal shield 26 can be formed of two symmetrical halves respectively fixedly mounted in the front side of the bottom cover shell 14 and the front side of the top cover shell 15.

Figure 6:
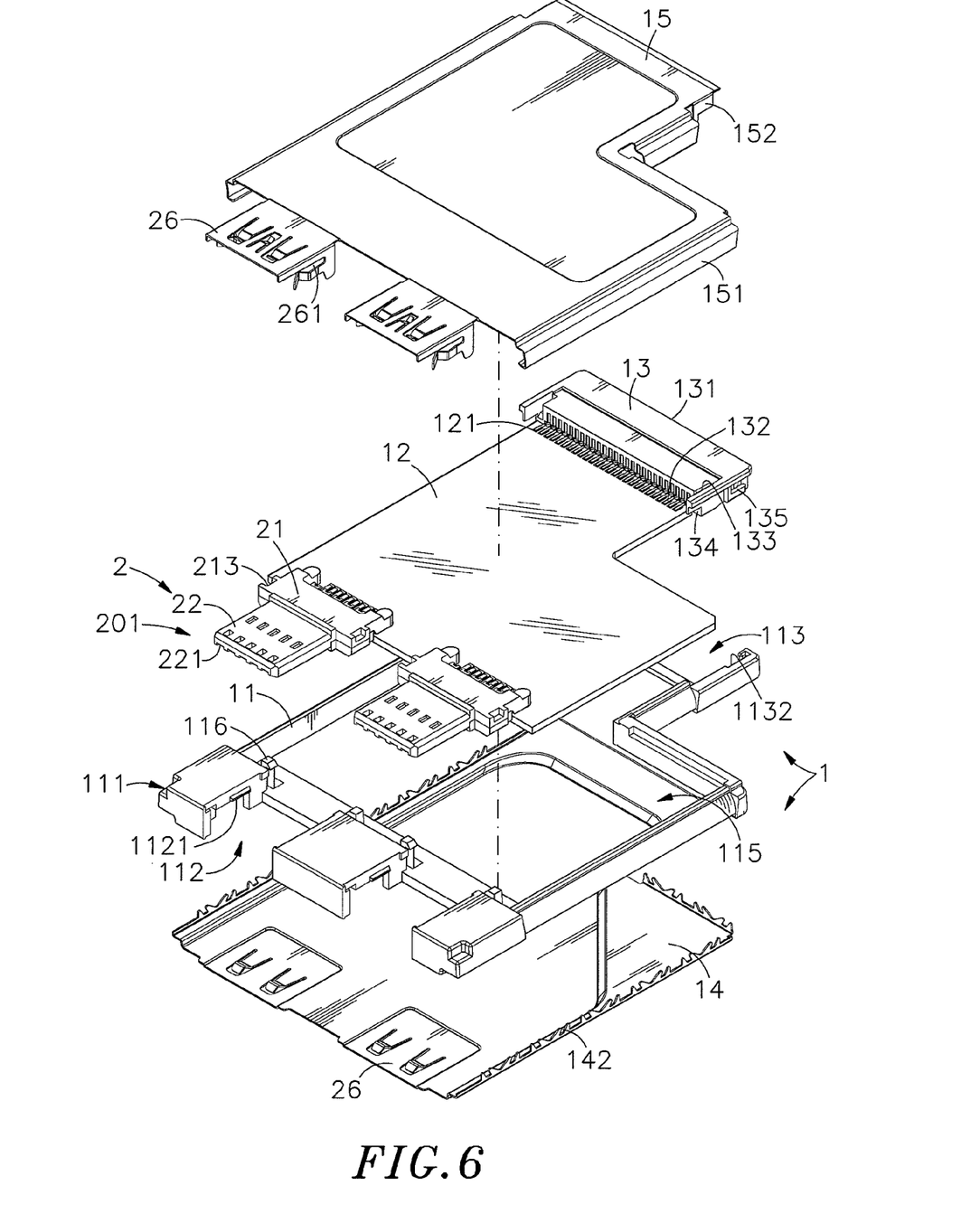
FIG. 6 is an exploded view of a USB based ExpressCard device in accordance with a second embodiment of the present invention.

Further, it is well known that the ExpressCard standard specifies two factors, ExpressCard/34 (34 mm wide) and ExpressCard/54 (54 mm wide, in an L-shape). According to the aforesaid first embodiment of the present invention, the ExpressCard 1 of the USB based ExpressCard device is configured subject to ExpressCard/34 specification. FIG. 6 shows a USB based ExpressCard device in accordance with a second embodiment of the present invention. This second embodiment is substantially similar to the aforesaid first embodiment with the exception that two USB3.0 connectors 2 are installed in the front side of the ExpressCard 1; the ExpressCard 1 is configured subject to ExpressCard/54 specification in an L-shape, having two openings 112 vertically cut through the front locating shell 111 for the mounting of two USB3.0 connectors 2.

Figure 5:
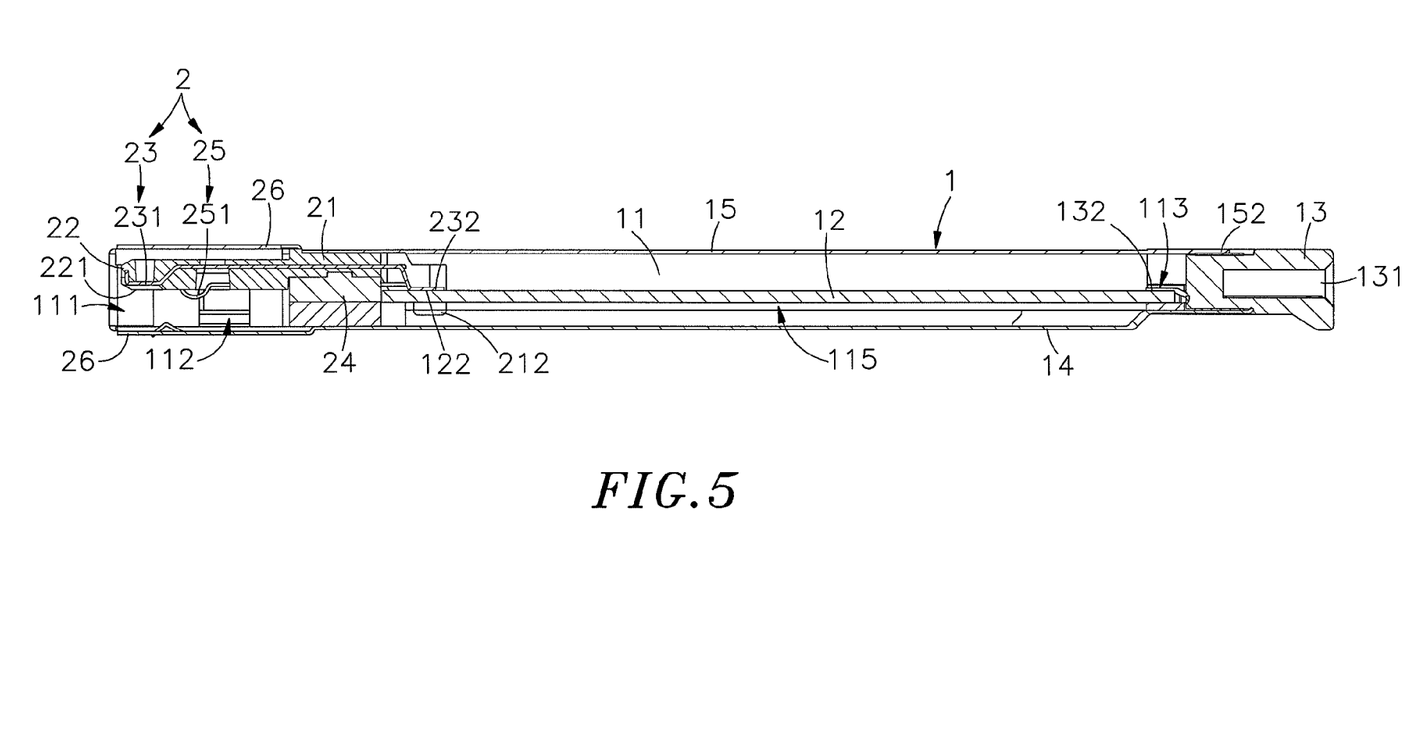
FIG. 5 is a sectional side view of the USB based ExpressCard device in accordance with the first embodiment of the present invention.
Figure 7:
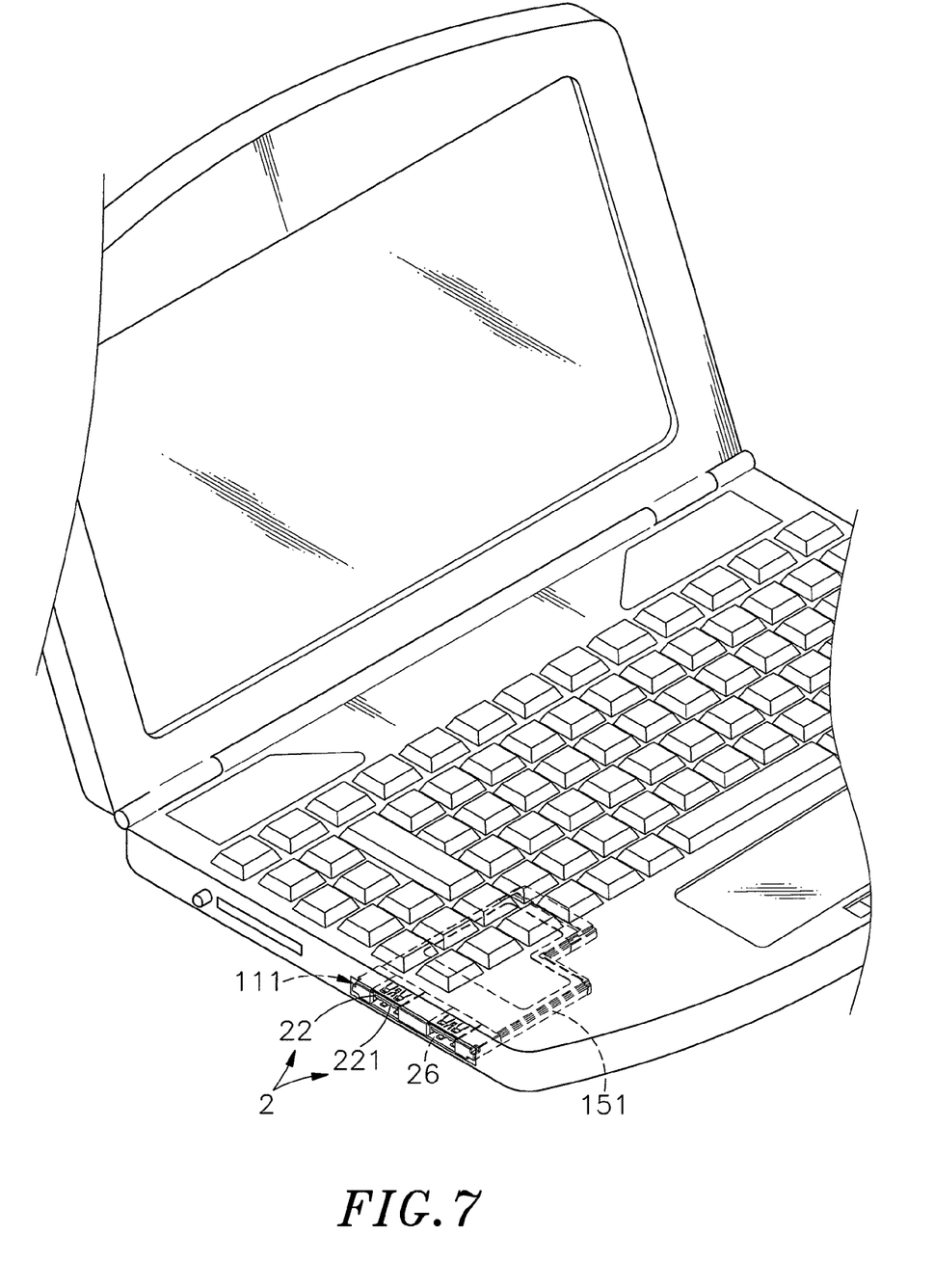
FIG. 7 is a schematic applied view of the second embodiment of the present invention, showing the USB based ExpressCard device inserted into an ExpressCard slot of a notebook computer.

Referring to FIGS. 5 and 7, when the USB based ExpressCard device is inserted into an ExpressCard slot of a first electronic apparatus (for example, notebook computer), the metal terminals 132 of the terminal holder block 13 are respectively electrically connected to the respective internal contacts in the ExpressCard slot of the electronic apparatus, and a USB connector (USB plug) of a second electronic apparatus (for example, card reader) can be inserted into the female type USB3.0 connector 2, allowing signal transmission between the first electronic apparatus (notebook computer) and the second electronic apparatus (card reader). Subject to the design of the opening 112 in the front locating shell 111 of the electrically insulative bracket 11, the USB3.0 connector 2 does not protrude over the front side of the ExpressCard 1. Therefore, the length and width of the ExpressCard 1 are the length and width of the USB based ExpressCard device, i.e., the USB based ExpressCard device can be completely inserted into the ExpressCard slot of an electronic apparatus without protruding over the outside wall of the electronic apparatus, avoiding accidental impact damage. Further, the first contacts 121 and second contacts 122 of the circuit board 12 are respectively electrically connected to the rear bonding portions 232;253 of the first and second conducting terminals 23;25 and the metal terminals 132 of the terminal holder block 13 so that the circuit board 12 works as adapter means for transmission of signal and power supply between the USB3.0 connector 2 and the electronic apparatus into which the USB based ExpressCard device is inserted.

As stated above, the invention provides a USB based ExpressCard device, which has the following features and advantages:

1. The metal terminals 132 of the terminal holder block 13 and the rear bonding portions 232;253 of the first and second conducting terminals 23;25 of the USB3.0 connector 2 are kept on a same horizontal plane and respectively electrically bonded to the first contacts 121 and second contacts 122 of the circuit board 12 by SMT (surface mounting technology) so that the height of the USB based ExpressCard device is minimized.
2. Because the USB3.0 connector 2 is positioned in the opening 112 of the ExpressCard 1 and does not protrude over the front side of the ExpressCard 1, the length and width of the USB based ExpressCard device are maintained equal to the length and width of the ExpressCard 1. Therefore, the USB based ExpressCard device can be completely inserted into the ExpressCard slot of an electronic apparatus, avoiding accidental impact damage.
3. The USB3.0 connector 2 is positioned in the opening 112 of the ExpressCard 1 and the metal shield 26 of the USB3.0 connector 2 can be formed of two symmetrical halves and respectively fixedly mounted in the front side of the bottom cover shell 14 and front side of the top cover shell 15 of the ExpressCard 1, facilitating installation.
4. The bottom locating rods 212 of the base member 21 of the USB3.0 connector 2 are respectively engaged into the mounting through holes 123 of the circuit board 12 so that the base member 21 holds down the first and second conducting terminals 23;25 of the USB3.0 connector 2 on the circuit board 12, avoiding disconnection of the rear bonding portions 232;253 of the first and second conducting terminals 23;25 of the USB3.0 connector 2 from the second contacts 122 of the circuit board 12, and enhancing device operation durability.

In conclusion, the invention provides a USB based ExpressCard device, which incorporates a USB3.0 connector and an ExpressCard together, and employs SMT (surface mounting technology) to bond the rear bonding portions of the first and second conducting terminals of the USB3.0 connector to the circuit board of the ExpressCard, avoiding increasing the size.

Although a particular embodiment of the invention has been described in detail for purposes of illustration, various modifications and enhancements may be made without departing from the spirit and scope of the invention. Accordingly, the invention is not to be limited except as by the appended claims.

What the invention claimed is:

1. A USB based Express Card device, comprising: an Express Card, said Express Card comprising an electrically insulative bracket, said electrically insulative bracket comprising a front locating shell located on a front side thereof, at least one opening vertically cut through said front locating shell, a rear terminal holder block mounting structure located on a rear side thereof, a circuit board mounted in said electrically insulative bracket between said front locating shell and said rear terminal holder block mounting structure, said circuit board comprising a set of first contacts located on a rear side thereof and a set of second contacts located on a front side thereof, a terminal holder block mounted in said rear terminal holder block mounting structure, said terminal holder block comprising a plurality of insertion slots extending through front and rear sides thereof and a plurality of metal terminals respectively mounted in said insertion slots and respectively electrically bonded to said first contacts of said circuit board, a bottom cover shell covered on a bottom side of said electrically insulative bracket and a top cover shell covered on a top side of said electrically insulative bracket; and at least one USB3.0 connector mounted in said at least one opening on said front locating shell of said electrically insulative bracket, each said USB3.0 connector comprising an electrically insulative body, a plurality of first conducting terminals and a plurality of second conducting terminals respectively mounted in said electrically insulative body, said first conducting terminals and said second conducting terminals each having a rear bonding portion horizontally extending out of said electrically insulative body and respectively electrically bonded to said second contacts of said circuit board, and a metal shield extended from said top and bottom covers surrounding said electrically insulative body;

wherein a front locating block attached to said insulative body comprises a retaining rib disposed at each of two opposite lateral sides of said opening; the metal shield of each said USB3.0 connector comprises two retaining holes respectively located on two opposite lateral sides thereof and respectively forced into engagement with the retaining ribs of said front locating block in each said opening.

2. The USB based ExpressCard device as claimed in claim 1, wherein said terminal holder block comprises two mounting grooves bilaterally located on a top side thereof; said top cover shell of said ExpressCard comprises two longitudinal coupling flanges respectively extended from two opposite lateral sides thereof and respectively hooked on two opposite lateral sides of said electrically insulative bracket and two rear positioning flanges bilaterally disposed at a rear side thereof and respectively engaged into the mounting grooves of said terminal holder block.

3. The USB based ExpressCard device as claimed in claim 1, wherein said rear terminal holder block mounting structure of said electrically insulative bracket comprises two retaining notches disposed at two opposite lateral sides thereof; said electrically insulative bracket comprises two longitudinal bottom mounting grooves disposed at two opposite lateral sides thereof; said bottom cover shell comprises two rear retaining rods bilaterally disposed at a rear side thereof and respectively engaged into the retaining notches of said rear terminal holder block mounting structure of said electrically insulative bracket, and two toothed longitudinal mounting flanges respectively longitudinally extending along two opposite lateral sides thereof and respectively engaged into the longitudinal bottom mounting grooves of said electrically insulative bracket.

4. The USB based ExpressCard device as claimed in claim 1, wherein said electrically insulative bracket comprises a center open space defined between said front locating shell and said rear terminal holder block mounting structure; said rear terminal holder block mounting structure comprising a retaining notch and a retaining groove disposed at each of two opposite lateral sides thereof; said circuit board is mounted in said center open space of said electrically insulative bracket; said terminal holder block comprises two retaining ribs respectively engaged into the retaining grooves of said rear terminal holder block mounting structure; said bottom cover shell comprises two rear retaining rods respectively engaged into the retaining notches of said rear terminal holder block mounting structure.

5. The USB based ExpressCard device as claimed in claim 1, wherein said rear terminal holder block mounting structure of said electrically insulative bracket comprises two retaining grooves disposed at two opposite lateral sides thereof; said terminal holder block comprises two mounting grooves respectively disposed at two opposite lateral sides thereof, two press portions respectively disposed at an outer side relative to the mounting grooves and pressed on said circuit board and two retaining ribs respectively engaged into the retaining grooves of said rear terminal holder block mounting structure of said electrically insulative bracket; said top cover shell comprises two rear positioning flanges respectively engaged into the mounting grooves of said terminal holder block.

6. The USB based ExpressCard device as claimed in claim 1, wherein said circuit board comprises a plurality of mounting through holes disposed adjacent to said second contacts; the electrically insulative body of each said USB3.0 connector comprises a base member, said base member comprising a plurality of locating rods respectively engaged into said mounting through holes of said circuit board.

7. The USB based ExpressCard device as claimed in claim 1, wherein the electrically insulative body of each said USB3.0 connector comprises a base member, said base member comprising two locating grooves bilaterally disposed at a top side thereof; said electrically insulative bracket comprises a plurality of retaining rods respectively engaged into the locating grooves of the base member of the electrically insulative body of each said USB3.0 connector.

8. The USB based ExpressCard device as claimed in claim 1, wherein the electrically insulative body of each said USB3.0 connector comprises a base member adapted for holding the associating first conducting terminals, said base member comprising a plurality of mounting rods, and a locating block mounted in a bottom side of said base member and adapted for holding the associating second conducting terminals, said locating block comprising a plurality of mounting holes, which receive the mounting rods of said base member.

9. The USB based ExpressCard device as claimed in claim 1, wherein the electrically insulative body of each said USB3.0 connector comprises a base member, a locating block mounted in a bottom side of said base member and a tongue plate forwardly extended from a front side of said base member above said locating block, said tongue plate comprising a plurality of first terminal grooves adapted for accommodating the associating first conducting terminals and a plurality of second terminal grooves adapted for accommodating the associating second conducting terminals.

10. The USB based ExpressCard device as claimed in claim 1, wherein said ExpressCard is an ExpressCard/54 in an L-shape.

\* \* \* \* \*